US008378334B2

(12) United States Patent
Rakshit et al.

(10) Patent No.: US 8,378,334 B2
(45) Date of Patent: Feb. 19, 2013

(54) LOW POWER FLOATING BODY MEMORY CELL BASED ON LOW-BANDGAP-MATERIAL QUANTUM WELL

(75) Inventors: Titash Rakshit, Hillsboro, OR (US); Gilbert Dewey, Hillsboro, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 13/069,333

(22) Filed: Mar. 22, 2011

(65) Prior Publication Data

US 2011/0211402 A1 Sep. 1, 2011

Related U.S. Application Data

(62) Division of application No. 12/119,234, filed on May 12, 2008, now Pat. No. 7,964,866.

(51) Int. Cl.
*H01L 29/778* (2006.01)
(52) U.S. Cl. ....... 257/14; 257/17; 257/20; 257/E29.246; 257/E29.252
(58) Field of Classification Search ........................ None
See application file for complete search history.

(56) References Cited

U.S. PATENT DOCUMENTS

| 5,410,160 | A | 4/1995 | Goronkin et al. |
| 6,933,548 | B1* | 8/2005 | King .............................. 257/262 |
| 7,601,980 | B2 | 10/2009 | Hudait et al. |
| 7,670,894 | B2 | 3/2010 | Rachmady et al. |
| 7,851,780 | B2 | 12/2010 | Hudait et al. |
| 2005/0250261 | A1* | 11/2005 | Bhattacharyya .............. 438/149 |
| 2006/0125010 | A1* | 6/2006 | Bhattacharyya .............. 257/347 |
| 2007/0138555 | A1* | 6/2007 | Bhattacharyya .............. 257/347 |

OTHER PUBLICATIONS

T. Tanaka et al., "Scalability Study on a Capacitorless IT-DRAM: From Single-Gate PD-SOI to Double-Gate FinDRAM", 2004 IEEE International Electron Devices Meeting Technical Digest, Dec. 2004, pp. 37.5.1-37.5.4.
S. Datta et al., Ultrahigh-Speed 0.5 V Supply Voltage In0.7GA0.3As Quantum Well Transistors on Silicon Substrate, 2007 IEEE Electron Device Letters, vol. 28, No. 8, Aug. 2007, pp. 685-687.

* cited by examiner

*Primary Examiner* — Victor A Mandala
(74) *Attorney, Agent, or Firm* — Blakely, Sokoloff, Taylor & Zafman LLP

(57) ABSTRACT

Embodiments of the invention relate to apparatus, system and method for use of a memory cell having improved power consumption characteristics, using a low-bandgap material quantum well structure together with a floating body cell.

6 Claims, 4 Drawing Sheets

LOW POWER FLOATING BODY MEMORY CELL BASED ON LOW-BANDGAP-MATERIAL QUANTUM WELL

This is a Divisional application of Ser. No. 12/119,234 filed May 12, 2008, now U.S. Pat. No. 7,964,866.

RELATED APPLICATION

None.

FIELD OF INVENTION

Embodiments of the invention relate to apparatus, system and method for use of semiconductor manufacturing processes, specifically semiconductor device manufacturing and integration.

BACKGROUND

There exists a continuing need to improve the feature size (i.e., smallest line width), speed and power consumption of semiconductor devices such as processors and DRAM storage.

The embodiments of the invention relate to a new type of memory cell, based on a floating body cell architecture and implemented using a quantum well FET for ultra low power application. The usage of a quantum well PET in a floating body architecture offers improved size, speed and power consumption compared to conventional DRAM (Dynamic Random Access Memory) and SRAM (Static Random Access Memory).

DETAILED DESCRIPTION

Figure 1:
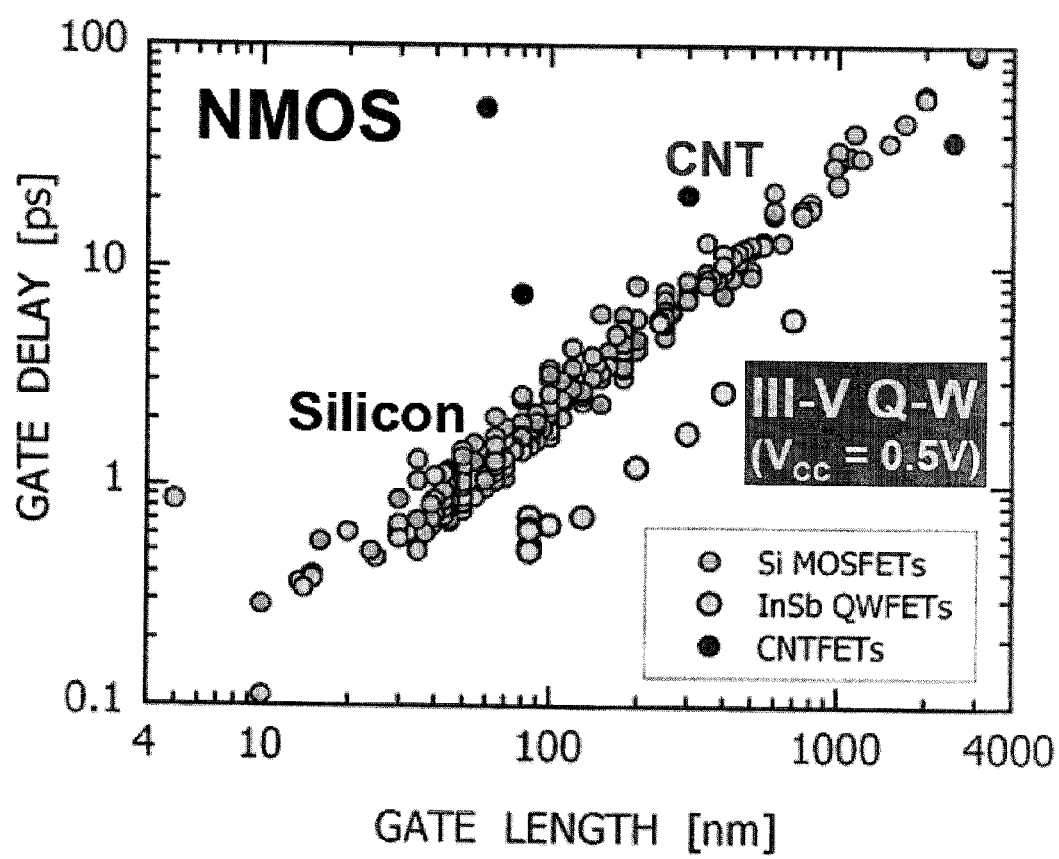
FIG. 1 shows gate delay characteristics of various FETs, including InSb QWFETs.

In the following description, numerous specific details are set forth. However, embodiments of the invention may be practiced without these specific details. In other instances, well-known circuits, structures and techniques have not been shown in detail in order not to obscure the understanding of this description.

The following glossary defines terms used herein unless a different meaning is assigned within the context of usage. The Authoritative Dictionary of IEEE Standards Terms, Seventh Edition, should be referenced for terms not otherwise defined herein.

| Acronym | Definition |
| --- | --- |
| DRAM | Dynamic random access memory |
| Ec | Conduction Band-edges of the semiconductors |
| Ev | Valence Band-edges of the semiconductors |
| FBC | Floating body cell |
| Gds | source-to-drain transconductance |
| HEMT | High electron mobility transistor |
| QWFET | Quantum well Field Effect Transistor |
| SOI | Silicon on insulator |
| SRAM | Static random access memory |
| Vds | voltage, drain to source |
| Vth | Threshold voltage |

Embodiments of the present invention include a digital memory cell, operable with improved bias voltage and improved power consumption, including a semiconductor substrate; a buffer layer formed on the silicon substrate; a quantum-well layer formed on the buffer layer, wherein the quantum-well layer has a bandgap barrier lower than the bandgap barrier of the buffer layer; a barrier layer formed on the quantum-well layer, wherein the barrier layer has a higher bandgap barrier than the bandgap barrier of the quantum-well layer; a gate formed on the barrier layer; a source formed overlying the barrier layer; and a drain formed overlying the barrier layer, wherein the gate, the source, and the drain act in cooperation as a transistor.

Optionally, embodiments of the present invention may include a quantum-well layer made of a compound formed from Group III-V elements. Optionally, this compound may be a material selected from the group consisting of InGaAs and InSb.

Optionally, embodiments of the present invention may be characterized by first a difference between the bandgap of the quantum-well layer and the bandgap of the buffer layer, and second a difference between the bandgap of the quantum-well layer and the bandgap of the barrier layer, which is sufficient to confine charge carriers within the quantum-well layer.

Optionally, embodiments of the present invention may be characterized in that the digital memory cell may have an electrically conductive contact layer formed between the barrier layer and the source overlying the barrier layer.

Optionally, embodiments of the present invention may be characterized in that the digital memory cell may have an electrically conductive contact layer formed between the barrier layer and the drain overlying the barrier layer.

Optionally, embodiments of the present invention may include a digital memory cell having a barrier layer made of either InAlAs or AlInSb.

Optionally, embodiments of the present invention may include a digital memory cell having a buffer layer made of either InAlAs or AlInSb.

Embodiments of the present invention may include a method for producing a binary logic state, including: applying a bias voltage to a drain of a floating body cell MOSFET, the MOSFET further having a source, a gate, and a threshold voltage; inducing impact ionization from the bias voltage; and trapping excess carriers generated by the impact ionization within a quantum-well layer, wherein an electric field produced by the excess carriers trapped in the quantum-well layer affects the threshold voltage.

Optionally, embodiments of the present invention may include a method that further includes applying a voltage across the source and the drain, wherein the current changes in response to the threshold voltage of the MOSPET.

Embodiments of the present invention may include an apparatus for storing digital data, having a plurality of digital memory cells having binary logic states, at least a portion of the memory cells comprising a quantum-well transistor in a floating body configuration; an apparatus to change the binary logic state of at least a portion of the digital memory cells; and an apparatus to detect the binary logic state of at least a portion of the digital memory cells.

Optionally, embodiments of the present invention may be characterized in that the quantum-well transistor includes a compound formed from Group III-V elements. Optionally, this element may be selected from the group consisting of InGaAs and InSb.

Embodiments of the present invention may include a system for storing digital data, including: a plurality of digital memory cells having binary logic states, at least a portion of the memory cells comprising a quantum-well transistor in a floating body configuration; an apparatus to change the binary logic state of at least a portion of the digital memory cells in response to an external stimulus; and an apparatus to detect the binary logic state of at least a portion of the digital memory cells, and to provide an external stimulus that depends upon the detected binary logic state.

Optionally, embodiments of the present invention may be formed on an integrated circuit chip.

Optionally, embodiments of the present invention may further include an apparatus to induce impact ionization from the bias voltage.

In recent years, transistor nanotechnology feature size has improved to 45 nm or less, using a variety of techniques that includes but is not limited to strained silicon devices, high-K oxides and metallic gates. Silicon devices exhibit lower electron mobility compared to non-silicon devices, thereby limiting the speed that can be attained with silicon semiconductor devices such as processors and conventional SRAM and DRAM memory cells. Continued improvement in speed, size and power consumption will require the introduction of more non-silicon elements using other structures such as metal gate, high-K oxides over a silicon substrate, carbon naontubes and tri-gate devices.

A quantum well based floating body device can replace either or both of the conventional memory cells—DRAMs and SRAMs. Conventional DRAM includes a capacitor in each memory cell. The capacitor is a key element in conventional DRAM cells and is an obstacle in reducing the size of the cell. The memory state of a DRAM cell is indicated by the charge storage state of the capacitor. An alternative structure for memory devices is a one-transistor gain cell called the floating body cell ("FBC"). In contrast to conventional DRAM, the FBC has no capacitor, thereby allowing for a smaller memory cell and eliminating parasitics associated with the capacitor.

Conventional SRAM cells consist of six transistors. The number of transistors in an FBC cell is one. Replacing conventional SRAM memory cells with a FBC memory cells provides a significant improvement to the area density of an on-chip memory device.

FBCs known in the art are based on Silicon-on-Insulator (SOI) technology in which the silicon channel is confined between gate oxide on top and an insulator at the bottom. FBCs have been described by T. Tanaka, et al., "Scalability Study on a Capacitorless 1T-DRAM: From Single-gate PD-SOI to Double-gate FinDRAM", 2004 IEEE International Electron Devices Meeting Technical Digest, December 2004. Once the excess carriers are generated, the minority carriers are confined in the silicon channel because they are unable to escape into the substrate. The majority carriers flow out into the terminal electrodes. The stored minority carriers alter the threshold voltage (Vth) that in turn is sensed by an altered linear current, thereby producing a memory action. In contrast, for a conventional Si metal-oxide-semiconductor field-effect transistor (MOSFET) configuration where the substrate is semiconducting (i.e., Si), the excess minority carriers rapidly flow out into the substrate.

The FBC is formed on an SOI wafer and consists of one MOSFET, whose body is electrically floating, i.e., the electrical potential is not tied specifically to an electrical potential of any of the terminal electrodes. Data "1" and Data "0" are distinguished by the change in threshold voltage generated by excess minority carrier density in the floating body of the MOSFET. DRAM and SRAM using the FBC structure achieve higher memory density and lower cost than that of conventional DRAM and SRAM. The achievable size reduction is particularly significant for SRAM. Memory using the FBC structures achieves very fast access times and cycle times due to its small parasitic resistance and capacitance around the memory cell as well as its non-destructive readout.

The advantages of FBC over conventional DRAM and SRAM include: (1) Scalability: compared to DRAM, there is no need for each memory cell to have a three-dimensional capacitor structure, such as a stack and a trench capacitor, that may be approaching the limits of miniaturization; Compared to SRAM, only one transistor is needed, rather than the six transistors required by SRAM; (2) High performance: there is relatively lower parasitic resistance as there is with a stack capacitor; and (3) Low cost: unlike a stack or trench capacitor, no additional manufacturing processes are required. Eliminating the six transistors required by SRAM lowers cost. FBC can be fabricated using the same manufacturing processes as conventional logic devices.

Nevertheless, the FBC on an SOI wafer still requires an undesirably high voltage to operate, and therefore requires more power and shortening the battery life of portable devices using the FBC on SOI technology for the main memory. The operation of a floating body cell memory device requires high drain side voltage and hence more operating power. The applied voltage typically needs to be at least higher than the bandgap of the channel material such that generation processes such as impact ionization is induced. The excess minority carriers thus generated remain in the channel and alter the threshold voltage of the device enabling a memory cell that can be used to read/write/store a '0' or a '1'.

The effects of quantum confinement take place when the quantum well thickness becomes comparable at the de Broglie wavelength of the carriers (generally electrons and holes), leading to energy levels called "energy subbands," i.e., the carriers can only have discrete energy values. Quantum wells are formed in semiconductors by having a material (e.g., gallium arsenide) sandwiched between two layers of a material with a wider bandgap, for instance aluminum arsenide. Because of their quasi-two dimensional nature, electrons in quantum wells have a sharper density of states than bulk materials.

Traditionally, quantum well devices have been used to make high-speed analog transistors. For instance, quantum wells are used to make High Electron Mobility Transistors ("HEMTs"), which are used in high-speed and low-noise semiconductor devices. To produce satisfactory devices capable of high RF output power, it is necessary for the device to have a high breakdown voltage. Unfortunately, this is difficult to achieve, in part, due to undesirable impact ionization resulting from electrons injected into the channel. Impact ionization is one of the major breakdown mechanisms of analog transistors, and can occur when hot electrons are injected into the channel. During injection, the electron can gain energy from the conduction band edge discontinuity. If the energy exceeds the impact ionization threshold energy, impact ionization may occur in the channel. Extra charge carriers are generated by the impact ionization, leading to excess noise which degrades the performance of analog quantum well transistors. As device feature sizes shrink, impact ionization becomes a more serious problem for analog transistors.

However, applicants have discovered that the impact ionization process, which is a hindrance in analog applications, can be used advantageously in digital applications, for instance as a replacement for traditional DRAM or SRAM memory cells. Embodiments of the present invention use the impact ionization process advantageously by combining the quantum well device in an FBC structure. In this configuration, impact ionization generates excess majority and minority carriers. The excess majority carriers will drain away through the electrodes, but the excess minority carriers generated by impact ionization remain in the channel and advantageously affect the threshold voltage of the memory cell. A memory cell using quantum well devices in an FBC structure is able to operate at lower power and lower voltages, as described below, compared to an FBC structure without quantum well devices.

To reduce the required operating voltage and operating power of a floating body memory cell, an improved structure for constructing the FBC memory cell can be used, called an NMOS quantum-well FET ("QWFET"), using Group III-V materials such as InSb or InGaAs. The source voltage for the memory cells is generally in the range of 0.5-0.7 volts.

Figure 4:
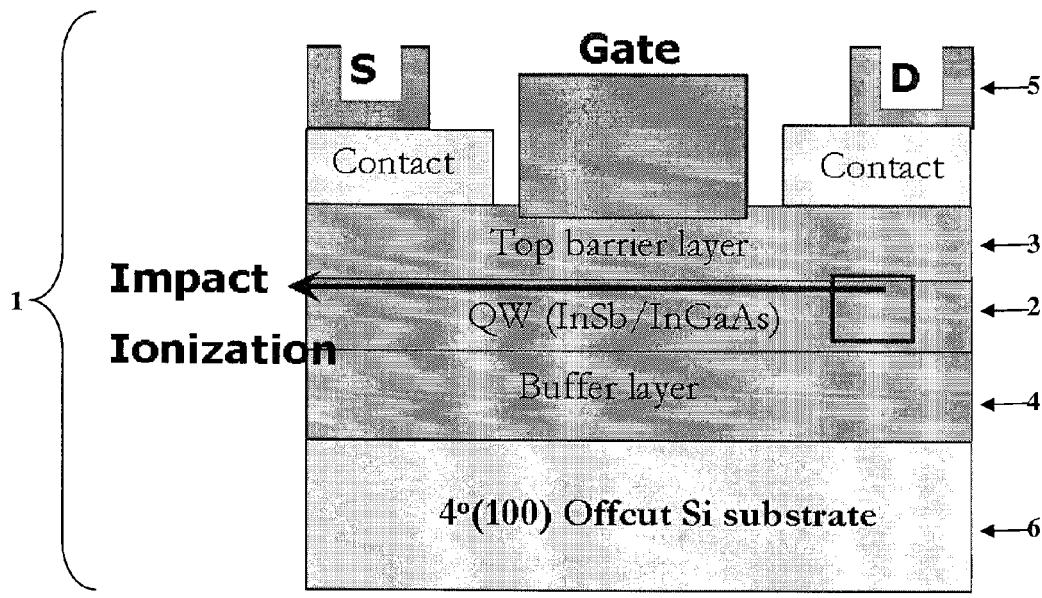
FIG. 4 shows a stack depiction of a Quantum Well Field Effect Transistor (QWFET) device with low bandgap III-V material (InSb or InGaAs) as the channel confined between high bandgap barrier layer at the top and high bandgap buffer layer at the bottom.

FIG. 4 shows an embodiment of the present invention, showing a stack depiction of a QWFET device 1 with low bandgap III-V material (InSb or InGaAs) as the channel 2 confined between high bandgap barrier layer 3 at the top and high bandgap buffer layer 4 at the bottom. If the channel 2 is made from InSb, then both the buffer layer 4 and barrier layer 3 are preferably made of AlInSb to accommodate lattice mismatch with the substrate 6. If the channel 2 is made from InGaAs, then both the buffer layer 4 and barrier layer 3 are preferably made of InAlAs to accommodate lattice mismatch with the substrate 6. Substrate 6 is shown in FIG. 4 as made of silicon, but substrate 6 may also be made of GaAs. Preferably, a contact layer is interposed between barrier level 3 and the source or drain. Optionally, the source or drain may sit directly on the barrier layer 3, but that would increase the parasitic resistance.

The stack of FIG. 4 utilizes a low bandgap material quantum well transistor structure that is used as a low power memory element. Preferably, the materials selected for the stack should be chosen in order to provide as large a difference in bandgap as possible. However material properties and fabrication techniques limit the achievable bandgap difference. For a typical InGaAs QWFET structure the bandgap difference is 0.6V. The low bandgap material (i.e., channel 2) is juxtaposed between high bandgap materials (i.e., high bandgap barrier layer 3 and high bandgap buffer layer 4). The high bandgap barrier layer 3 provides electrical isolation between the portions of QWFET 1 above and below the high bandgap barrier layer 3, thereby forming the floating body structure. In operation, a transient voltage bias is applied to the drain 5 of the QWFET 1, which induces impact ionization and causes the generation of excess carriers near the drain 5, the excess carriers including both majority carriers and minority carriers. The excess majority carriers flow out of the QWFET 1 and into the electrodes. The minority excess carriers remain in the quantum well, and are contained in the quantum well by the adjacent high bandgap materials (layers 2 and 4) such that the threshold voltage is affected and a logic 0 or logic 1 is written or detected. The material stack shown in FIG. 4 can be used for both enhancement mode or depletion mode devices. In enhancement mode, the upper barrier layer under gate may be thinner and the gate metal material may be different.

The memory cell senses whether minority excess carriers have accumulated in the quantum well by the effect upon the threshold voltage Vth. Typically, the source is set to 0 volts, the drain is connected to a bitline of a memory cell array, and the gate is connected to a wordline of the memory cell array. When excess carriers exist in the floating body (i.e., in the quantum well) and Vth lowers, the memory cell state can be regarded as a logic "1". On the other hand, when excess carriers are swept out of the floating body by forward bias on the body-drain junction and Vth becomes higher, the cell state can be regarded as a logic "0".

FIG. 1 shows the gate delay characteristics of various FETs, including InSb QWFETs. As is apparent from FIG. 1, the InSb QWFET exhibits a smaller gate delay for a given gate length, compared to Si MOSFETs or carbon nanotube FETs ("CNTFET"), enabling the InSb QWFET to operate at a higher frequency.

InSb QWFET devices have been demonstrated utilizing 85 nm gate length, in both enhancement and depletion modes, with unity gain cutoff frequency, $f_T$, of 305 GHz and 256 GHz, respectively, at 0.5V $V_{DS}$, suitable for high speed, very low power logic applications. The InSb transistors demonstrate 50% higher unity gain cutoff frequency, $f_T$, than silicon NMOS transistors while consuming 10 times less active power. These devices are described by S. Datta et al., "85 nm Gate Length Enhancement and Depletion mode InSb Quantum Well Transistors for Ultra High Speed and Very Low Power Digital Logic Applications", Electron Devices Meeting, 2005 IEDM Technical Digest, 5-7 Dec. 2005, pp. 763-766 (hereinafter, "Datta").

Group III-V materials are useful for embodiments of the present invention because these materials have well-established uses in commercial communications and optoelectronic products. Group III-V quantum well devices show an approximate 100-fold improvement in electron mobility, and an approximately 20-fold improvement in electron conductivity compared to silicon. Together, these improvements allow the design of logic devices having an improved combination of higher speed and lower power. Fabrication of semiconductor devices using Group III-V materials typically is accomplished as a top-down patterning, rather than a bottom-up chemical synthesis, and are integrated onto a silicon substrate, rather than replacing the bulk silicon entirely.

Figure 2:
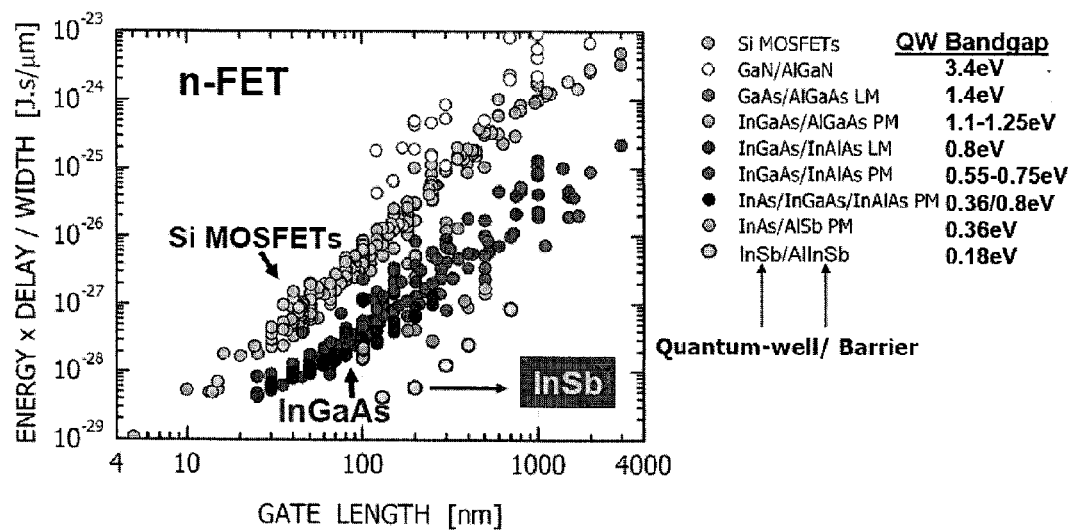
FIG. 2 shows Energy-Delay product of several kinds of electronic devices known in the art.

A figure of merit for semiconductor devices is the Energy-Delay product, typically expressed in units of electron volts (eV). FIG. 2 shows the Energy-Delay product of several kinds of electronic devices known in the art. InGaAs quantum well devices exhibit acceptable Energy-Delay product (generally in the range 0.36 eV-1.25 eV) and are suitable for low $V_{cc}$ driving voltages (generally 0.5V-0.7V). The low $V_{cc}$ driving voltages are enabled by the low bandgap and high mobility characteristic of Group III-V materials.

Figure 3:
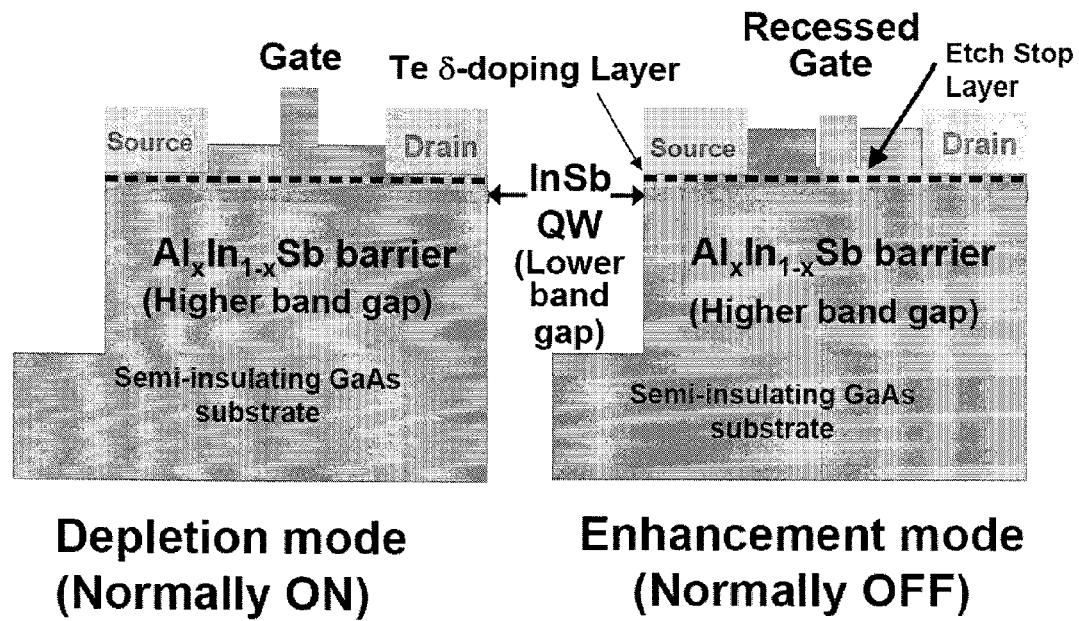
FIG. 3 shows a simplified layout of a quantum well transistor.

FIG. 3 shows a simplified layout of a quantum well transistor. The quantum well transistor may be fabricated in either depletion mode (i.e., normally "on") or in enhancement mode (i.e., normally "off"). Elements of the quantum well transistors include: (1) A channel composed of a low bandgap material juxtaposed between high bandgap materials; (2) A transient drain side bias applied to induce impact ionization such that excess carriers are generated near the drain; and (3) adjacent high bandgap materials that act to contain the minority carriers in the quantum well, such that the threshold voltage is affected and a 0 or 1 is written or detected.

Group III-V quantum well FET (QWFET) structures lend themselves naturally to a floating body cell configuration. A low bandgap quantum well 2 is confined in between two high bandgap materials, top barrier layer 3 and bottom buffer layer 4 (FIG. 4). The Group III-V channel material of layer 2 is typically Indium Antimonide (InSb) or Indium Gallium Arsenide (InGaAs). InSb and InGaAs have bandgaps of approximately 0.2V and approximately 0.6V respectively compared to a bandgap of Si that is 1.12V. Hence a significantly lower drain bias induces impact ionization in the Group III-V QWFET channel, generating excess carriers. The generated excess minority carriers are confined in the Group well by high bandgap adjacent materials as shown in FIG. 4. This enables a lower power operation of a Group III-V FBC memory cell compared to the conventional silicon-on-insulator (SOI) based memory cell.

Figure 5:
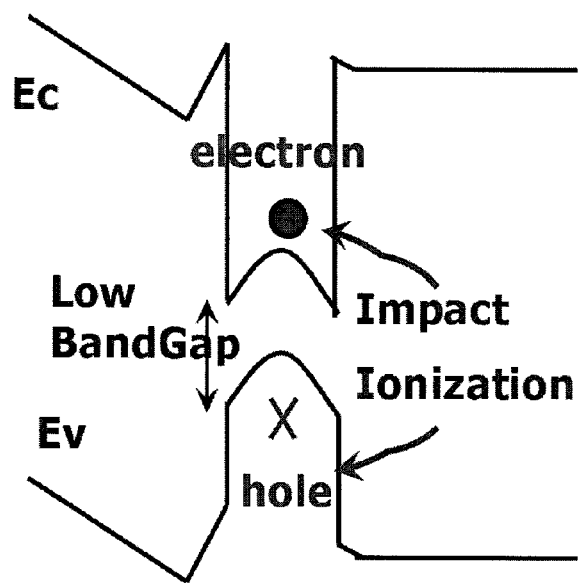
FIG. 5 shows a schematic of the impact ionization process that generates excess electrons and holes in a standard QWFET device.

FIG. 5 shows a schematic of the impact ionization process that generates excess electrons and holes in a standard Quantum Well Field Effect Transistor (QWFET) stack. Ec and Ev represent the Conduction and Valence Band-edges of the semiconductors. The excess minority carriers are confined in the well by high bandgap adjacent materials as shown by their Conduction (Ec) and Valence BandEdges (Ev).

Figure 6:
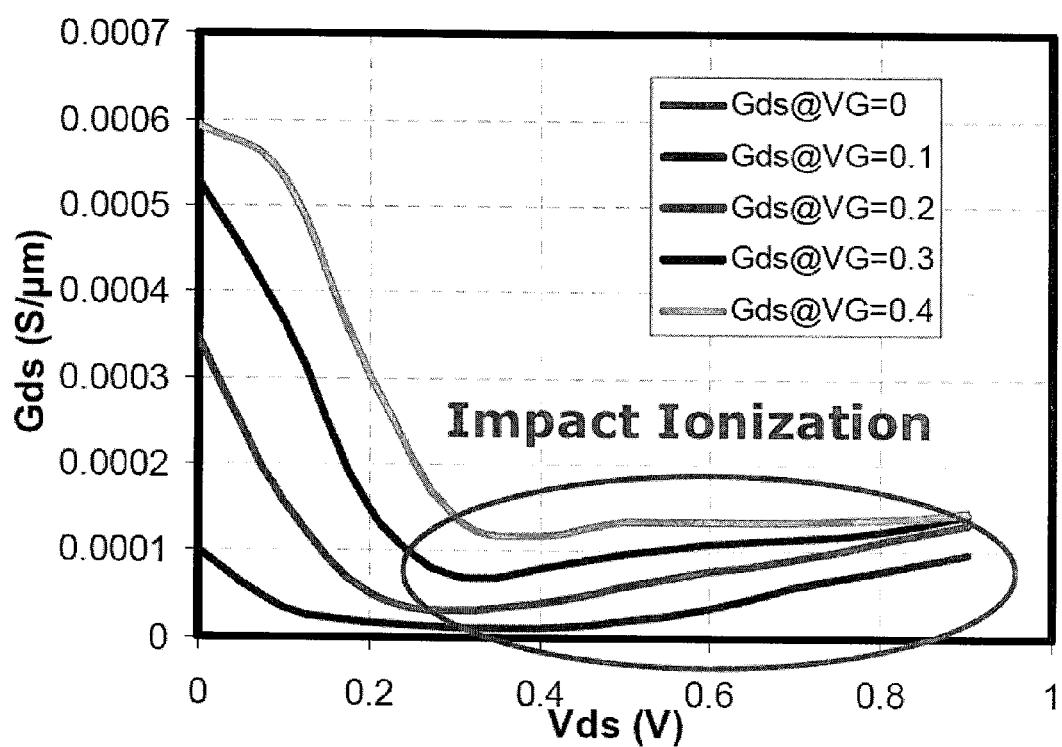
FIG. 6 shows Gds vs Vds in a depletion-mode InGaAs QWFET.

Experimental evidence of impact ionization in a depletion-mode InGaAs QWFET is shown in the Gds vs Vds curves of FIG. 6. The effect of excess generated carriers via impact ionization is shown by the increase in Gds at Vds greater than about 0.3V, which is the threshold in this case for excess carrier generation. When operated in enhancement-mode the threshold is expected to increase, but still will be significantly lower than SOI based memory cells.

Fabrication of a device according to embodiments of the present invention can proceed using processes already known in the semiconductor manufacturing art. Such processes include a typical Group III-V quantum well transistor process flow with InSb or InGaAs as the channel confined by a typical barrier layer on top and a buffer layer at the bottom. This process is more fully described in Datta (ibid.), the entire content of which is hereby incorporated by reference.

This application may disclose several numerical range limitations that support any range within the disclosed numerical ranges even though a precise range limitation is not stated verbatim in the specification because the embodiments of the invention could be practiced throughout the disclosed numerical ranges. Finally, the entire disclosure of the patents and publications referred in this application, if any, are hereby incorporated herein in entirety by reference.

The invention claimed is:

1. An apparatus for storing digital data, comprising:
   a plurality of digital memory cells having binary logic states, at least a portion of the memory cells comprising a quantum-well transistor in a floating body configuration, said quantum-well transistor having a channel composed of a low bandgap material between high bandgap materials;
   an apparatus to change the binary logic state of at least a portion of the digital memory cells; and
   an apparatus to detect the binary logic state of at least a portion of the digital memory cells.

2. The apparatus of claim 1, wherein the quantum-well transistor comprises a compound formed from Group III-V elements.

3. The apparatus of claim 2, wherein the compound comprises a material selected from the group consisting of InGaAs and InSb.

4. A system for storing digital data, comprising:
   a plurality of digital memory cells having binary logic states, at least a portion of the memory cells comprising a quantum-well transistor in a floating body configuration, said quantum-well transistor having a channel composed of a low bandgap material between high bandgap materials;
   an apparatus to change the binary logic state of at least a portion of the digital memory cells in response to an external stimulus; and
   an apparatus to detect the binary logic state of at least a portion of the digital memory cells, and to provide an external stimulus that depends upon the detected binary logic state.

5. The system of claim 4, wherein the system is formed on an integrated circuit chip.

6. The system of claim 4, further comprising an apparatus to induce impact ionization from the bias voltage.

\* \* \* \* \*